(12) United States Patent
Matsukawa et al.

(10) Patent No.: US 7,238,034 B2
(45) Date of Patent: Jul. 3, 2007

(54) MEMORY CARD CONNECTOR (75) Inventors: Jun Matsukawa, Yamato (JP);
Mitsuhiro Tomita, Yamato (JP);
Yasuyoshi Matsumoto, Yamato (JP);
Koji Yamane, Yamato (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/529,660

(22) PCT Filed: Oct. 3, 2003

(86) PCT No.: PCT/US03/31617

§ 371 (c)(1),
(2), (4) Date: Oct. 21, 2005

(87) PCT Pub. No.: WO2004/032289

PCT Pub. Date: Apr. 15, 2004

(65) Prior Publication Data

US 2006/0172572 A1    Aug. 3, 2006

(30) Foreign Application Priority Data

Oct. 3, 2002    (JP)    ............................. 2002-290656

(51) Int. Cl.
*H01R 13/62* (2006.01)
(52) U.S. Cl. ..................................................... 439/159
(58) Field of Classification Search ................ 439/159, 439/157
See application file for complete search history.

(56) References Cited

U.S. PATENT DOCUMENTS 4,838,804 A    6/1989    Banjo et al.

(Continued)

FOREIGN PATENT DOCUMENTS

JP    11-204203    7/1999

(Continued)

OTHER PUBLICATIONS

International Search Report of PCT/US03/31617, Oct. 3, 2002.

*Primary Examiner*—Tulsidas C. Patel
*Assistant Examiner*—Phuongchi Nguyen
(74) *Attorney, Agent, or Firm*—Charles S. Cohen (57) ABSTRACT

A memory card connector has an interior cavity into which a memory card is inserted to a temporary retained position and then to a fully inserted position. The connector includes an insulating housing having a rear terminal-mounting section at a rear of the cavity. A plurality of terminals are mounted on the terminal-mounting section and have contact portions for engaging contacts on the memory card. A slider is movably mounted on the housing and is engageable with the memory card for movement therewith. The slider is slidable along a side wall of the housing. The slider has a projection engageable in a recess in a side of the memory card. A sheet metal shell covers at least a portion of the insulating housing and includes a cover plate overlying at least a portion of the cavity. A side wall plate depends from the cover plate and overlies at least a portion of the side wall of the housing. A spring structure is stamped and formed out of an opening in the side wall plate and is engageable with the slider to bias the projection of the slider into the recess in the memory card. The spring structure is integral with the side wall plate at opposite edges of the opening.

7 Claims, 11 Drawing Sheets

U.S. PATENT DOCUMENTS

| | | |
|---|---|---|
| 5,725,394 A | 3/1998 | Banakis et al. |
| 5,889,649 A | 3/1999 | Nabetani et al. |
| 6,219,231 B1 | 4/2001 | Nabetani et al. |
| 6,267,295 B1 | 7/2001 | Amagai et al. |
| 6,475,005 B2 | 11/2002 | Yu |
| 6,843,670 B2 * | 1/2005 | Yamaguchi et al. ........ 439/159 |
| 6,932,632 B1 * | 8/2005 | Lai ........................... 439/157 |

2002/0109967 A1  8/2002  Nabetani et al.

FOREIGN PATENT DOCUMENTS

| | | |
|---|---|---|
| JP | 2001-291552 | 10/2001 |
| JP | WO02/07269 A2 * | 1/2002 |
| JP | 2002-083650 | 3/2002 |
| JP | 2004-127733 | 4/2004 |

* cited by examiner

PRIOR ART

MEMORY CARD CONNECTOR

FIELD OF THE INVENTION

This invention generally relates to the art of electrical connectors and, particularly, to a memory card connector.

BACKGROUND OF THE INVENTION

Memory cards are known in the art and contain intelligence in the form of a memory circuit or other electronic program. Some form of card reader reads the information or memory stored on the card. Such cards are used in many applications in today's electronic society, including video cameras, digital still cameras, smartphones, music players, ATMs, cable television decoders, toys, games, PC adapters, multi-media cards and other electronic applications. Typically, a memory card includes a contact or terminal array for connection through a card connector to a card reader system and then to external equipment. The connector readily accommodates insertion and removal of the card to provide quick access to the information and program on the card. The card connector includes terminals for yieldingly engaging the contact array of the memory card. Ejecting devices often are provided for facilitating inserting and ejecting the memory card to and from the card connector.

A typical memory card connector includes an insulating housing structure usually having a lateral terminal-mounting section across the rear of the connector. The contacts or terminals of the connector are mounted on this lateral section. An overlying shell substantially covers the insulating housing and includes a cover plate defining a top of a cavity for receiving a memory card. The housing may have one or two legs projecting at right angles forwardly from one or both sides of the lateral section to define opposite sides of the cavity. The shell has a pair of side walls overlying the side legs of the housing. As stated above, an ejecting device may be provided for facilitating inserting and ejecting the memory card. The ejecting device may include a slider movably mounted on the housing and engageable with the memory card for movement therewith.

When a user inserts a memory card into the connector, it would be highly desirable if the user could get a tactile indication or "feel" that the card is at least temporarily contained in the connector. A temporary retention also can prevent the card from coming loose and falling out of the connector, resulting in possible loss of the card or at least breakage of the card on which important data is recorded. It has been known to use the slider of the ejecting device as a means for temporarily retaining the memory card in the connector.

For instance, in Japanese Unexamined Patent Publication (Kokai) No. 2001-291552, a lock spring 76 is projected into a slider 51 so that a projection 76a of the lock spring is resiliently mated with a side edge surface of a memory card 56 as seen in FIG. 2 thereof.

Another example of a connector for a memory card is disclosed in Japanese Unexamined Patent Publication (Kokai) No. 2002-83650. In that publication, a slider 5 includes a movable body 6 as seen in FIGS. 1 and 2 thereof. In order to reduce parts in the prior art and to reduce the size of the connector, the movable body is backed up by a cantilever spring piece 26 formed on a side plate portion 23 of a steel case 1 (a metal shell). A tip end surface 61 of the movable body can evacuate a card from the connector. The tip end surface is engaged with a concave portion 120 formed in a side edge of a memory card 100 to temporarily retain the card in the connector.

Figure 15:
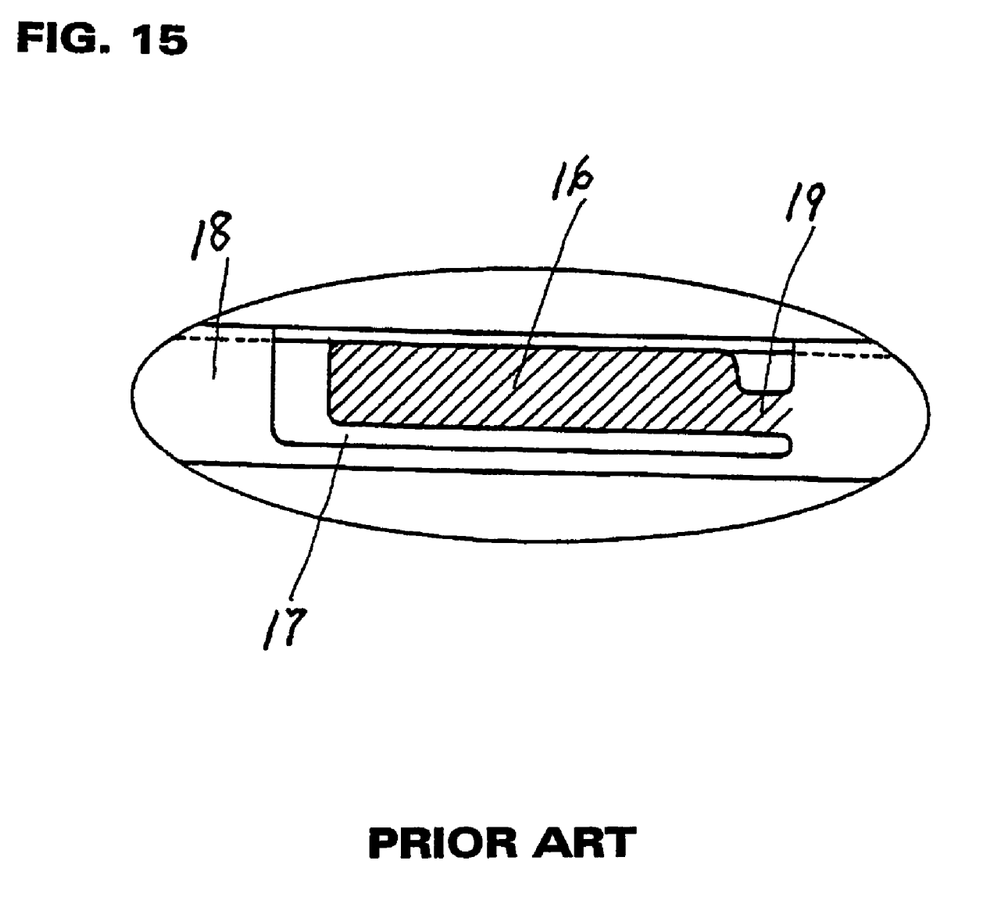
FIG. 15 is a side elevational view of the prior art as described in the "Background", above.

A further example is shown in FIG. 15 herein. As shown, a spring plate 16 is stamped and formed out of an opening 17 in a side wall plate 18 of a metal shell of a connector. Again, the spring plate is of a cantilever structure and is joined to the side wall plate of the metal shell by a connecting section 19 at one end of spring plate 16. The spring plate is effective to engage a slider and bias a projection on the slider into engagement with a recess in a side edge of a memory card to temporarily retain the card. Unfortunately, such a cantilevered structure of spring plate 16 results in considerable weakening of side wall plate 18 of the metal shell.

The present invention is directed to solving the various problems of the prior art as described above.

SUMMARY OF THE INVENTION

An object, therefore, of the invention is to provide a new and improved memory card connector of the character described.

In the exemplary embodiment of the invention, the connector has an interior cavity into which a memory card is inserted to a temporary retained position and then to a fully inserted position. The connector includes an insulating housing having a rear terminal-mounting section at a rear of the cavity. A plurality of terminals are mounted on the terminal-mounting section of the housing and have contact portions for engaging contacts on the memory card. A slider is movably mounted on the housing and is engageable with the memory card for movement therewith. The slider is slidable along a side wall of the housing and has a projection engageable in a recess in a side of the memory card. A sheet metal shell covers at least a portion of the insulating housing and includes a cover plate overlying at least a portion of the cavity. A side wall plate of the shell depends from the cover plate and overlies at least a portion of the side wall of the housing. A spring structure is stamped and formed out of an opening in the side wall plate and is engageable with the slider to bias the projection of the slider into the recess in the memory card. The spring structure is integral with the side wall plate at opposite edges of the opening.

According to one aspect of the invention, the spring structure comprises a spring plate which is elongated in the direction of movement of the slider and memory card. The elongated spring plate has opposite end sections which are integral with the side wall plate of the metal shell within the opening. The elongated spring plate has a central section between the opposite end sections, and the central section is wider than the end sections.

According to another aspect of the invention, the slider includes a contact surface opposing the side wall plate of the metal shell and generally parallel thereto, along with a pushing surface opposing the spring structure of the metal shell. The pushing surface is oblique to the contact surface. The slider also includes an abutting surface for engaging a front end of the memory card.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims.

The invention, together with its objects and the advantages thereof, may be best understood by reference to the following description taken in conjunction with the accompanying drawings, in which like reference numerals identify like elements in the figures and in which.

DETAILED DESCRIPTION OF THE PREFERRED EMBODIMENTS

Figure 1:
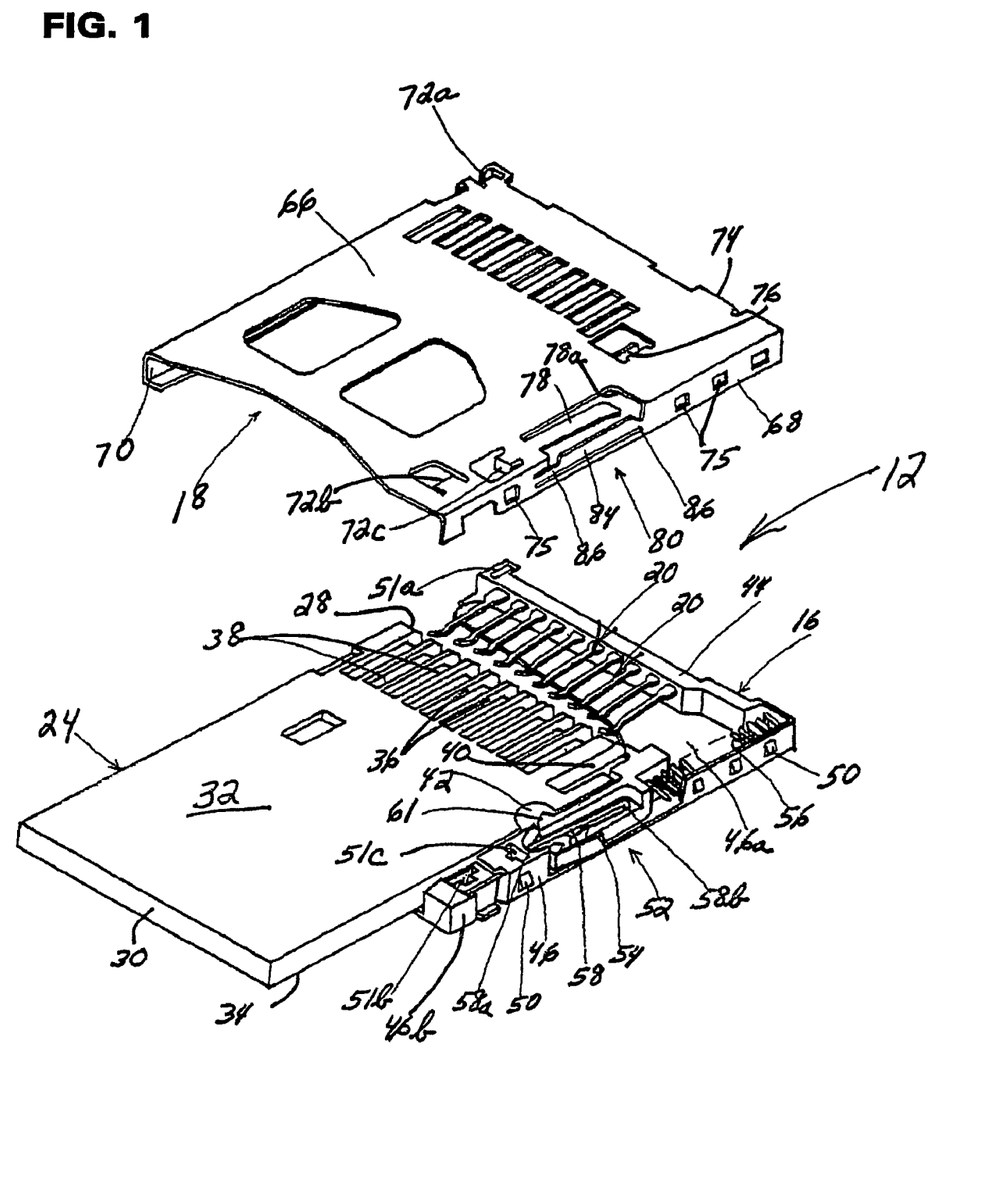
FIG. 1 is a perspective view of a first embodiment of a memory card connector according to the invention, with the metal shell lifted to facilitate the illustration.
Figure 2:
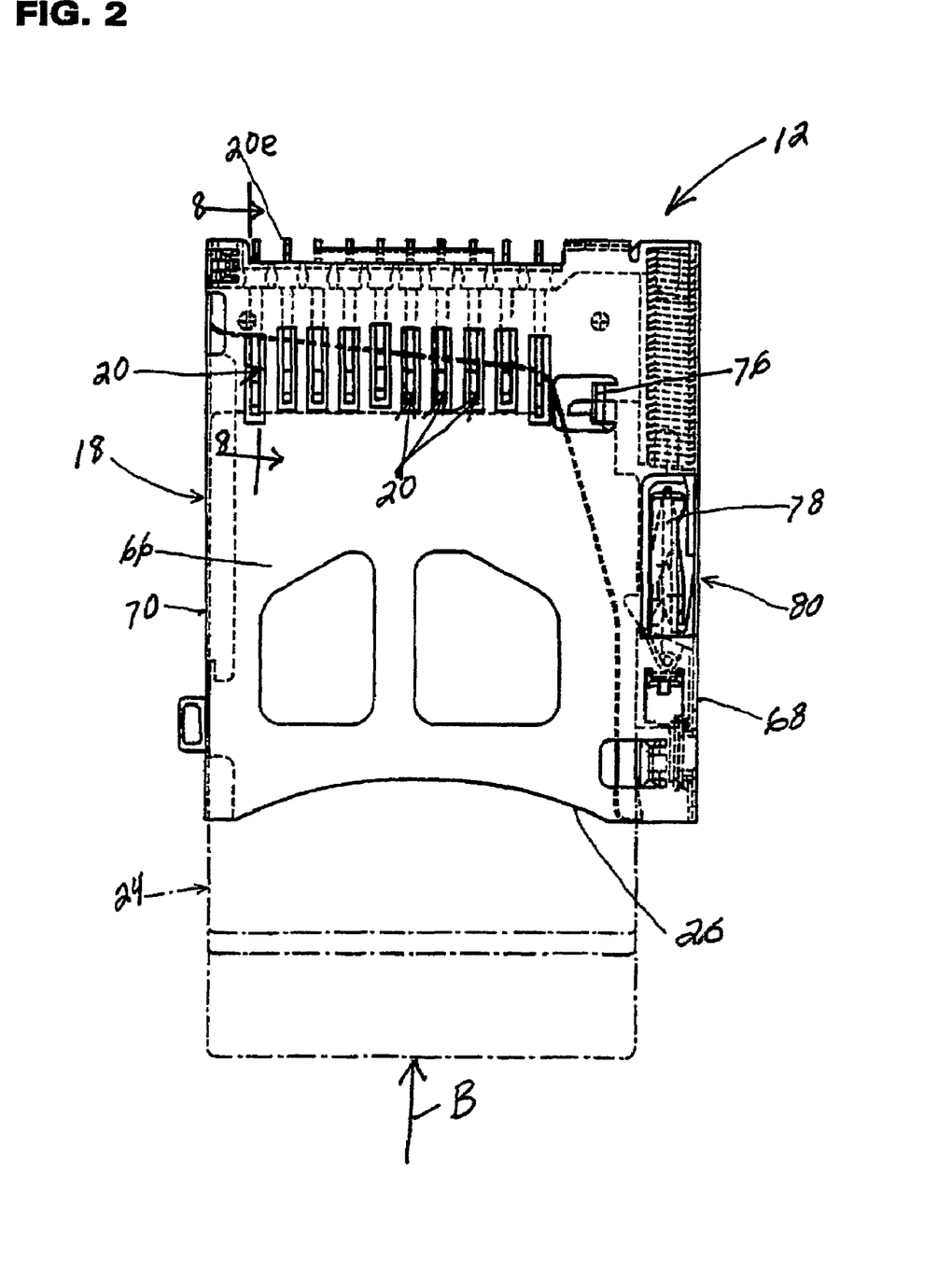
FIG. 2 is a top plan view of the connector of FIG. 1.

Referring to the drawings in greater detail, and first to FIGS. 1–6, the invention is embodied in a memory card connector, generally designated 12, which includes an insulating housing, generally designated 16, and a stamped and formed sheet metal shell, generally designated 18, covering the insulating housing. The housing mounts a plurality of conductive terminals, generally designated 20, mounted on the housing in a side-by-side array transversely across a rear of the housing as seen in FIGS. 1 and 2. The housing and metal shell 18 combine to define a cavity, generally designated 22 (FIG. 5), for receiving a memory card, generally designated 24, inserted into a front receptacle area 26 (FIG. 2) of the connector in the direction of arrow "B".

As best seen in FIG. 1, memory card 24, when properly oriented for insertion into the connector, includes a front leading edge 28, a rear trailing edge 30, a top flat surface 32 and a bottom flat surface 34. A plurality of contact slots 36 are cut into top flat surface 32, with the slots opening at front leading edge 28 of the card. Contacts 38 are disposed at the bottoms of the slots for engaging contact portions of terminals 20. A wrong insertion-proof slot 40 is cut into top flat surface 32 of the card. Finally, a recess 42 is cut into one side edge of the card, for purposes described hereinafter.

Insulating housing 16 is shown best in FIG. 1 but also in conjunction with FIG. 2. The housing is generally L-shaped to define a terminal-mounting section 44 which extends transversely across the rear of the housing, along with a longitudinal side wall section 46 which includes a thin bottom plate 46a. The side wall section extends forwardly at one end of rear terminal-mounting section 44, generally at a right-angle thereto, and also includes a side wall block 46b. A plurality of terminal-receiving passages 48 extend through rear terminal-mounting section 44. For purposes to be described in greater detail hereinafter, a plurality of latch bosses 50 project outwardly from the side of the housing. Finally, a top mounting slot 51a is formed in the distal end of terminal mounting section 44 and two top mounting slots 51b and 51c are formed in the top of side wall block 46b for facilitating the mounting of metal shell 18 to the housing as will be seen hereinafter.

Figure 8:
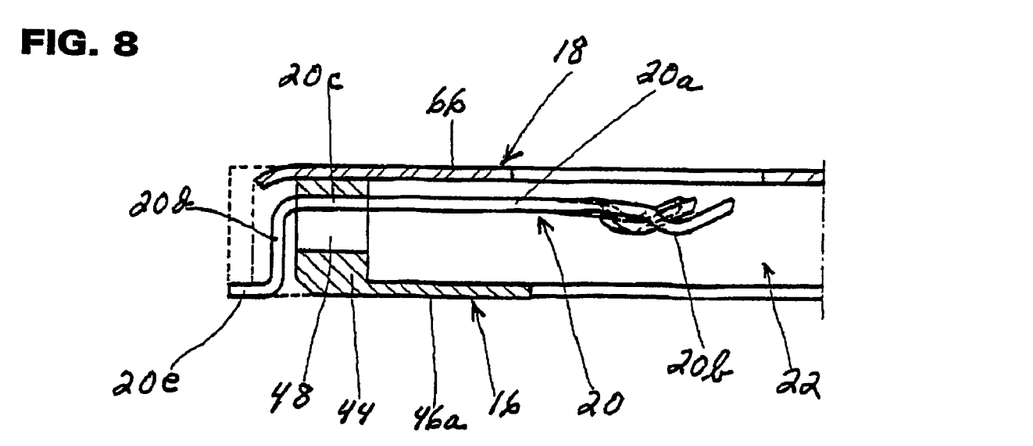
FIG. 8 is an enlarged, vertical section taken generally along line 8—8 in FIG. 2.

Referring to FIG. 8 in conjunction with FIGS. 1 and 2, each terminal 20 includes a contact arm 22a cantilevered forwardly into the card-receiving cavity 22 and terminating in a contact portion 20b for engaging a respective one of the contacts 38 in a respective contact slot 36 in memory card 24. Contact arm 20a projects forwardly from a mounting base 20c of the terminal which is press-fit into a respective one of the terminal-receiving passages 48 in terminal-mounting section 44 of the housing. A solder tail portion 20d of the terminal projects outwardly of the rear of the housing and terminates in a soldering pad 20e for solder-connection to a respective circuit trace on a printed circuit board (not shown). The housing has a plurality mounting pegs 53 (FIGS. 3–6) for insertion into appropriate mounting holes in the printed circuit board.

Figure 9:
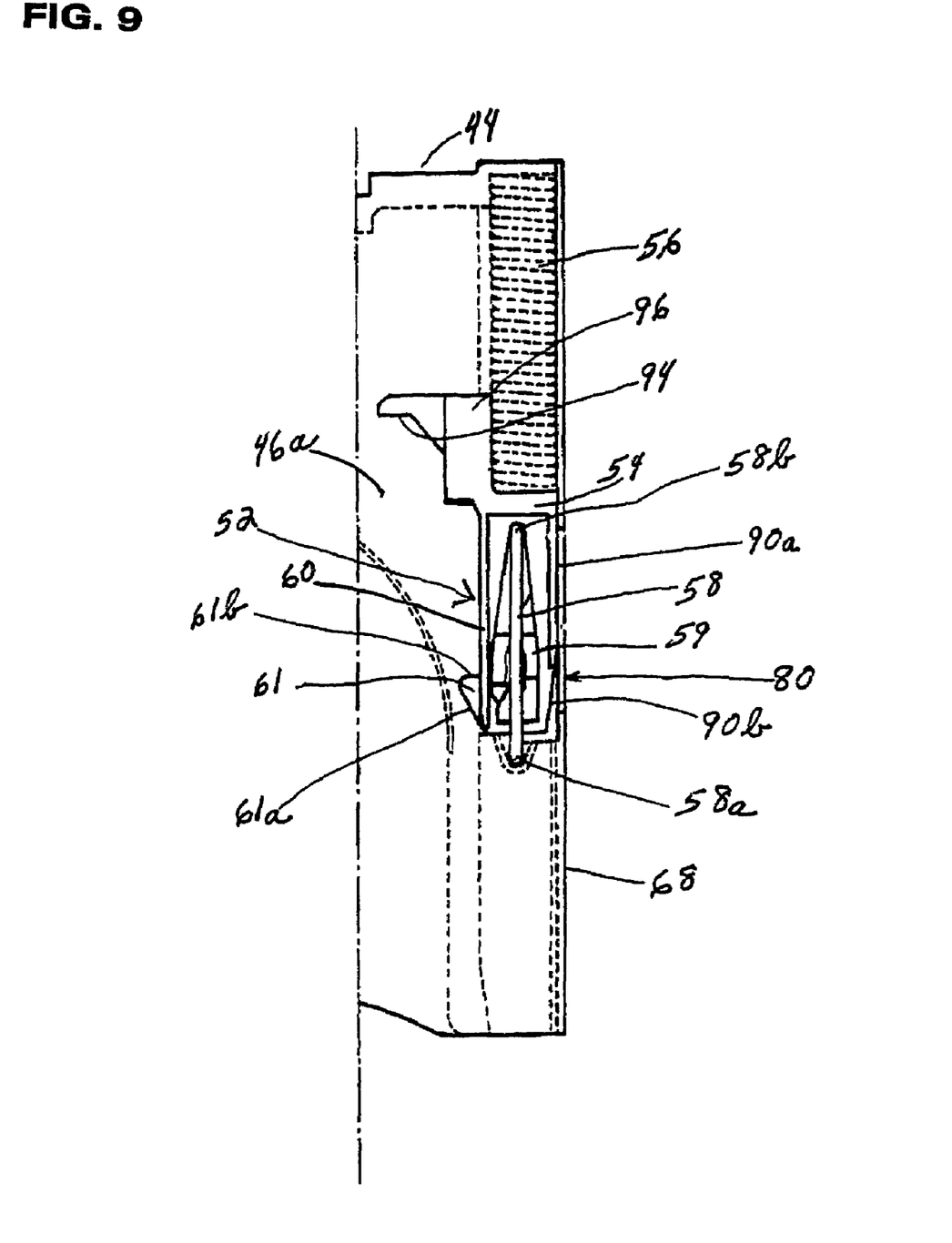
FIG. 9 is an enlarged, fragmented top plan view in the area of the slider, with the metal shell removed to facilitate the illustration, and with the slider in an inoperative condition.

Referring to FIG. 9 in conjunction with FIGS. 1 and 2 longitudinal side wall section 46 of housing 16 mounts a push/pull-type card ejection mechanism, generally designated 52 in FIGS. 1 and 9. The card ejection mechanism is provided for ejecting and removing memory card 24 from the connector and is of a type known in the art. For example, see Japanese Unexamined Patent Publication No. 2001-291552. Suffice it to say, the card ejection mechanism includes a cam slider 54 slidable on bottom plate 46a of longitudinal side wall section 46, a coil spring 56 for urging the slider toward the front receptacle area 26 (FIG. 2) of the connector, a pin member 58 for cooperating with a heart-shaped cam slot 59 in the slider. The push/pull-type card ejection mechanism 52 is well known in the art. Pin member 58 is a flat, inverted U-shaped structure defining end pin portions 58a and 58b. Pin portion 58a at one end of pin member 58 is pivotally engaged in side wall section 46, and pin portion 58b at the other end of pin member 58 is engaged in the heart-shaped cam slot 59 formed in the upper surface of cam slider 54 as seen in FIG. 9. Coil spring 56 is located between cam slider 54 and a portion of rear terminal-mounting section 44 of the housing. The cam slider also includes a locking arm 60 having a projection 61 which is caught by recess 42 in the side edge of memory card 24 as seen in FIG. 1, so that the cam slider moves with the memory card in its insertion direction while compressing coil spring 56. When the card is unlatched, it is ejected from the card-receiving cavity under the force of coil spring 56. Projection 61 has an oblique surface 61a and an abrupt surface 61b, for purposes described hereinafter.

Figure 5:
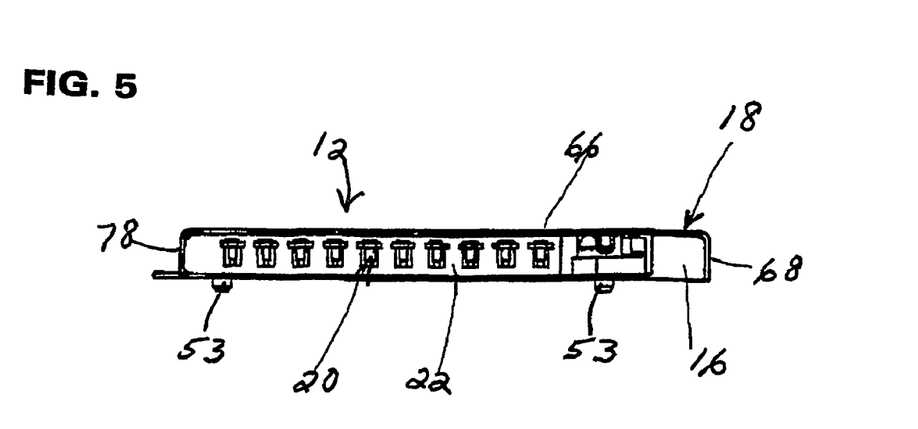
FIG. 5 is a front elevational view of the connector.
Figure 6:
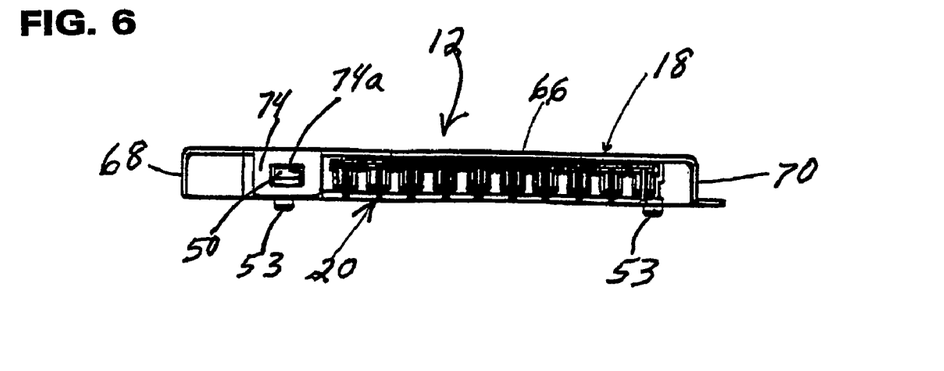
FIG. 6 is a rear elevational view of the connector.

Referring to FIGS. 1 and 2, metal shell 18 is stamped and formed of sheet metal material and is large enough to cover substantially the entire area defined by insulating housing 16. The metal shell includes a top cover plate 66 and a pair of depending opposite side wall plates 68 and 70 which run in a front-to-rear direction of the connector. Side wall plate 68 covers card ejection mechanism 52 and longitudinal side wall section 46 of the housing. Side wall plate 70 defines the opposite side of card-receiving cavity 22 as best seen in FIGS. 2, 5 and 6. A plurality of depending mounting tabs 72a, 72b and 72c are stamped and formed out of the shell for forcing or press-fitting into top mounting slots 51a, 51b and 51c, respectively, of the housing. A latch tab 74 at the rear of the metal shell has an opening 74a (FIG. 6) for snap-latch engagement with one of the latch bosses 50 of the housing. As best seen in FIG. 1, side wall plate 68 of the metal shell has a plurality of openings 75 which latchingly engage latch bosses 50 on the outside of longitudinal side wall section 46 of the housing. Therefore, when the shell is mounted to the housing, mounting tabs 72a–72c of the shell are press-fit into mounting slots 51a–51c of the housing, rear latch tab 74 of the shell snaps over a latch boss 50 of the housing and openings 75 in side wall plate 68 of the housing snap over latch bosses 50 at the side of the housing.

As best seen in FIGS. 1 and 2, top cover plate 66 of metal shell 18 also has a spring arm 78 which is stamped and formed out of an opening 78a in the top cover plate. This spring arm 78 engages pin member 58 of ejection mechanism 52 and biases the pin member, especially pin portion 58b, toward the heart-shaped cam groove 59. With top cover plate 66 forming a substantial wide area, opening 78a from which spring arm 78 is formed, does not inhibit the overall strength of the cover plate.

Figure 3:
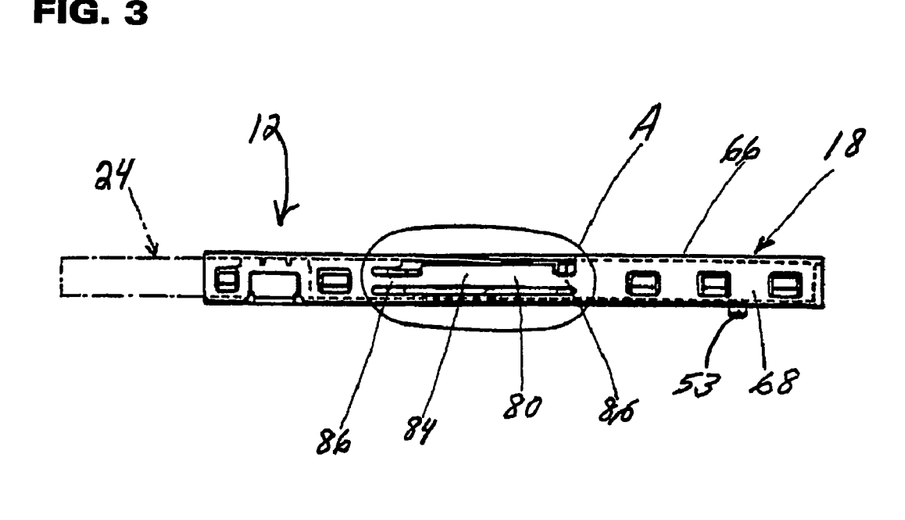
FIG. 3 is a side elevational view of the connector, looking at the bottom or right-hand side as viewed in FIG. 2.
Figure 4:
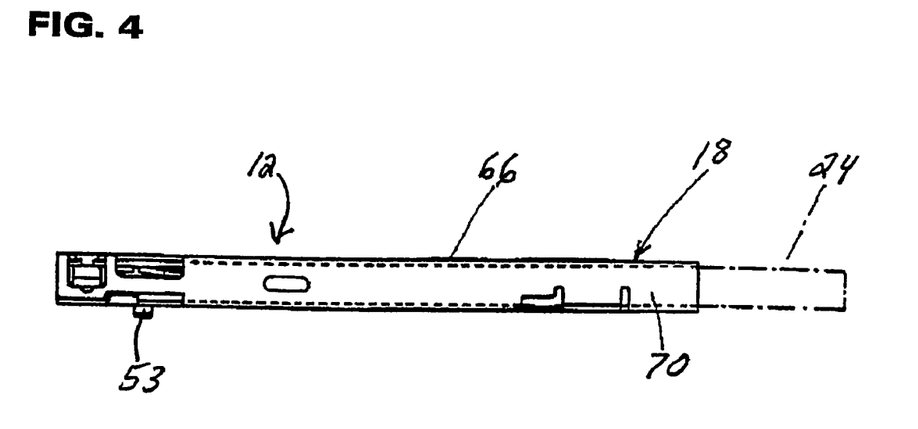
FIG. 4 is a side elevational view of the connector, opposite the side of FIG. 3.
Figure 7:
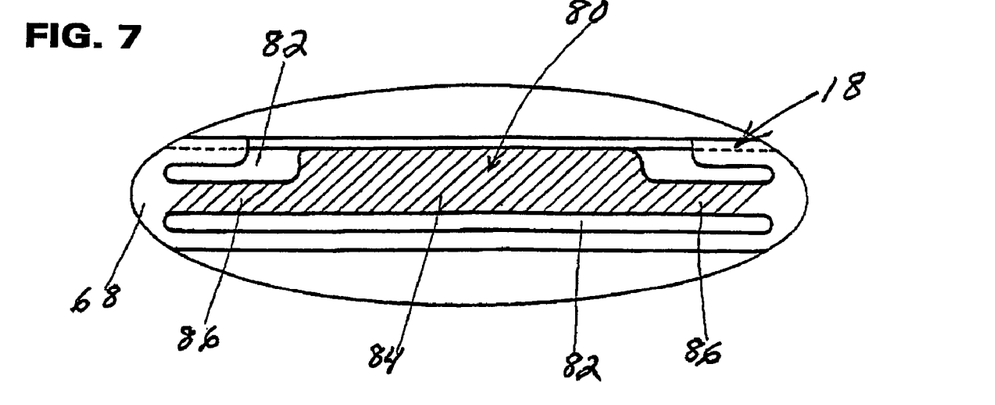
FIG. 7 is an enlarged view of the area encircled at "A" in FIG. 3.

Referring to FIG. 7 in conjunction with FIGS. 1 and 3, a spring structure, generally designated 80, is stamped and formed out of an opening 82 in side wall plate 68 of metal shell 18. Generally, the spring is engageable with cam slider 54 to bias projection 61 into recess 42 of the memory card. The spring structure is integral with side wall plate 68 of the metal shell. Specifically, spring structure 80 comprises a spring plate 84 which is elongated in the direction of movement of the slider and memory card. The elongated spring plate has opposite end sections 86 which are integral with side wall plate 68. Therefore, there is a continuity of metal material that extends along the side wall plate and completely through spring structure 80. In other words, there is no break or opening longitudinally of side wall plate 68, and the strength of the side wall plate is maintained notwithstanding the existence of spring structure 80, i.e., spring plate 84. In other words, the rigidity of side plate portion 68 of the metal shell in the longitudinal direction is retained because of the continuity through spring plate 84 afforded by opposite end sections 86 which are integral with the side plate portion of the metal shell at the opposite edges of opening 82.

The operation of the connector will now be described in relation to FIGS. 9–13. Specifically, FIG. 9 shows a condition of the connector prior to inserting memory card 24 into card-receiving cavity 22. Cam slider 54 of ejection mechanism 52 is biased by coil spring 56 to a preliminary stand-by position.

Figure 10:
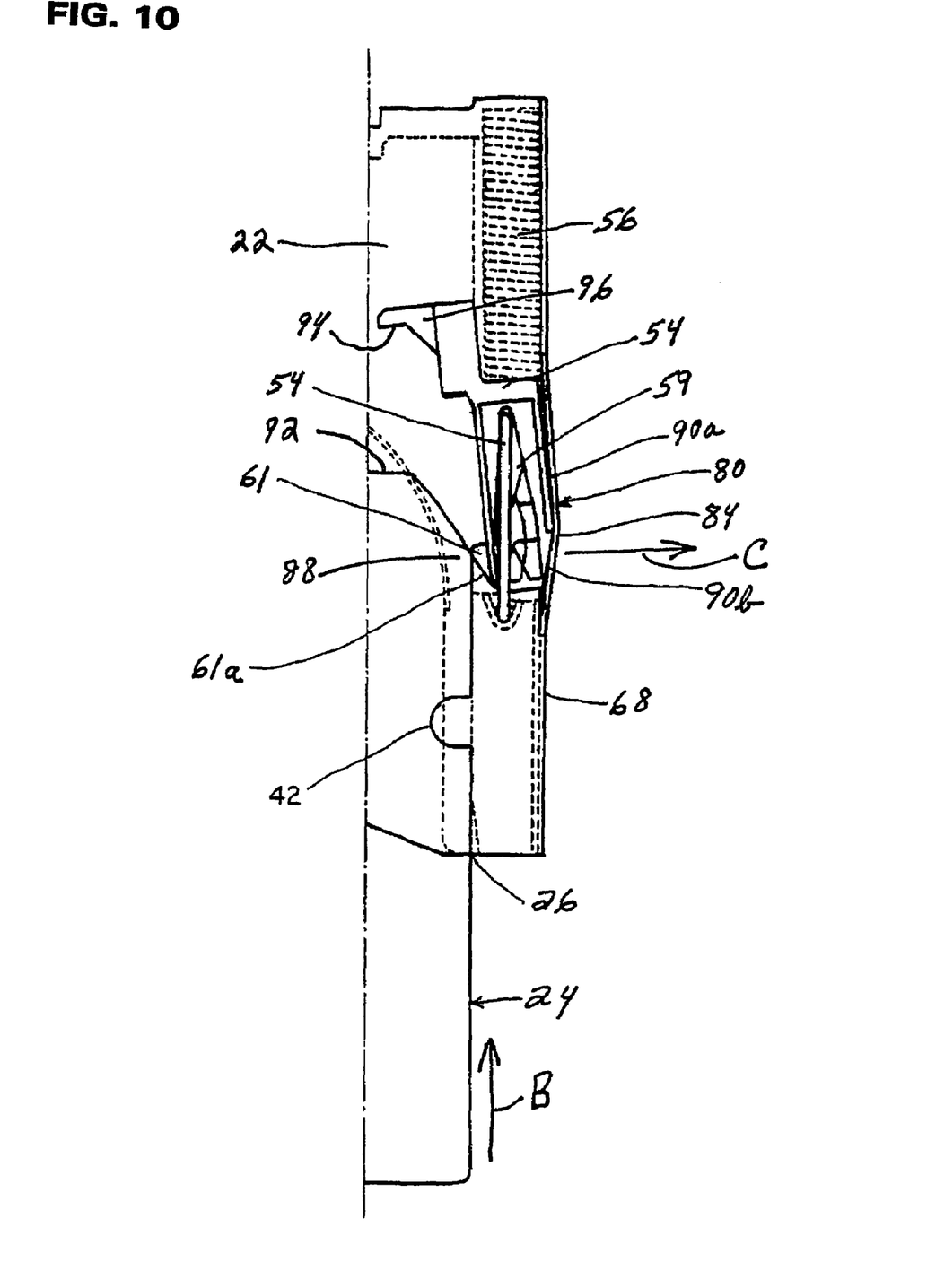
FIG. 10 is a view similar to that of FIG. 9, showing a memory card initially being inserted into the connector and into engagement with the projection of the slider.

When memory card 24 is inserted in the direction of arrow "B", into the connector as seen in FIG. 10, a front side edge 88 of the card engages tapered surface 61a of projection 61 of cam slider 54 and biases the cam slider outwardly in the direction of arrow "C" against spring plate 84 of spring structure 80.

To that end, and referring back to FIG. 9 in conjunction with FIG. 10, the outside surface of cam slider 54 includes a contact surface 90a which runs generally parallel to longitudinal side wall section 46 of the housing and side wall plate 68 of the metal shell. The outside surface of the slider also includes an oblique pushing surface 90b which is oblique to surface 90a and which engages spring structure 80 as seen in FIG. 10. Again, front side edge 88 (FIG. 10) of the memory card engages tapered surface 61a of projection 61 to bias the slider outwardly in the direction of arrow "C" against spring structure 80.

Figure 11:
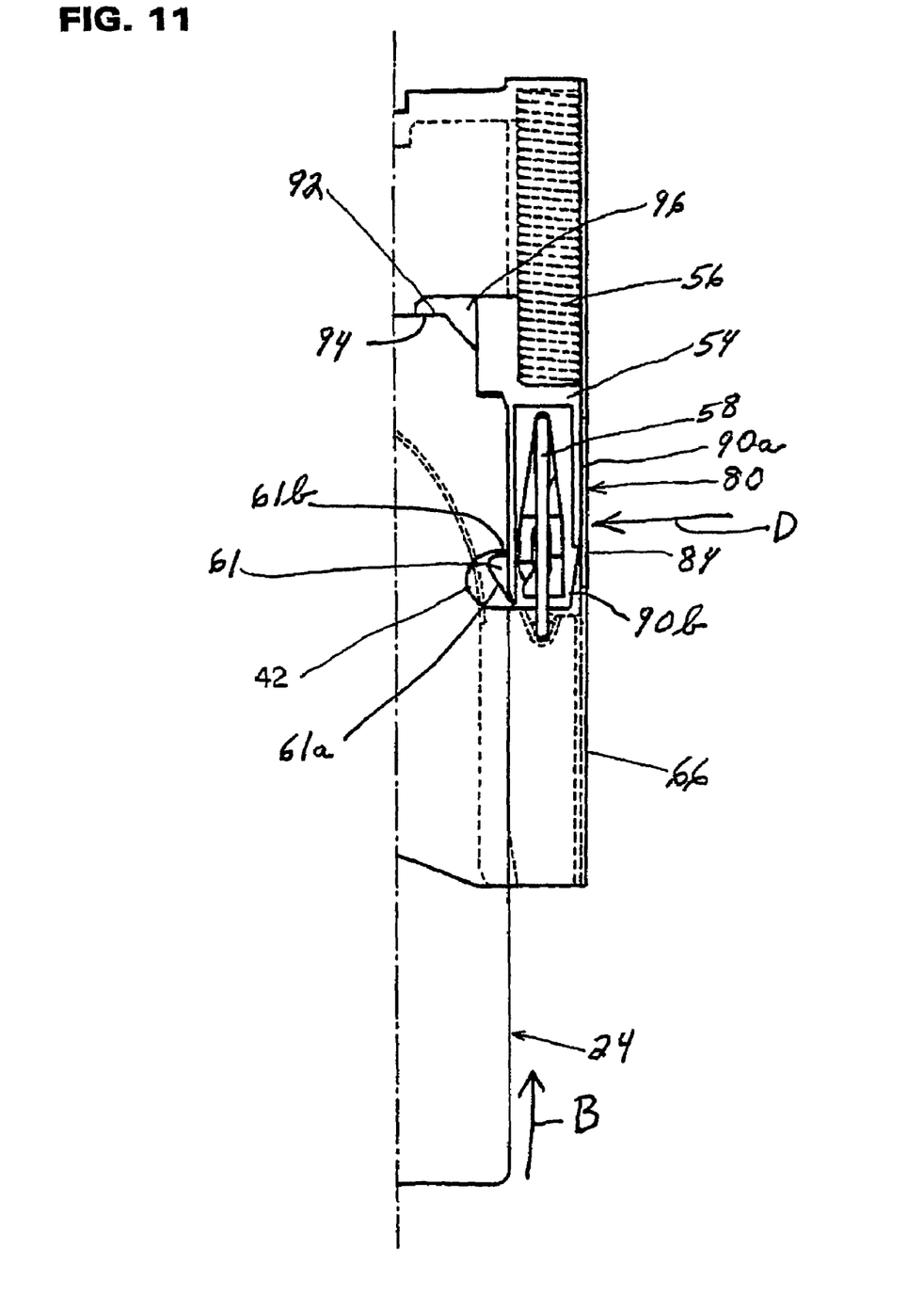
FIG. 11 is a view similar to that of FIG. 10, but with the memory card fully engaged with the slider and the projection of the slider engaged in the recess of the memory card, and defining the temporary retained position of the memory card.

FIG. 11 shows memory card 24 having been pushed inwardly in the direction of arrow "B" until projection 61 snaps into recess 42 in the side edge of the card. The front edge of recess 42 abuts against abrupt surface 61b of projection 61. This defines the temporary retained position of the memory card, and it can be seen that spring structure 80 has pushed cam slider 54 back inwardly in the direction of arrow "B" and, effectively, bias projection 61 into recess 42.

In the temporary retained position of the memory card, a front end 92 of the memory card engages an abutting surface 94 of the cam slider. The abutting surface is on an inwardly projecting tip 96 of the cam slider.

Figure 12:
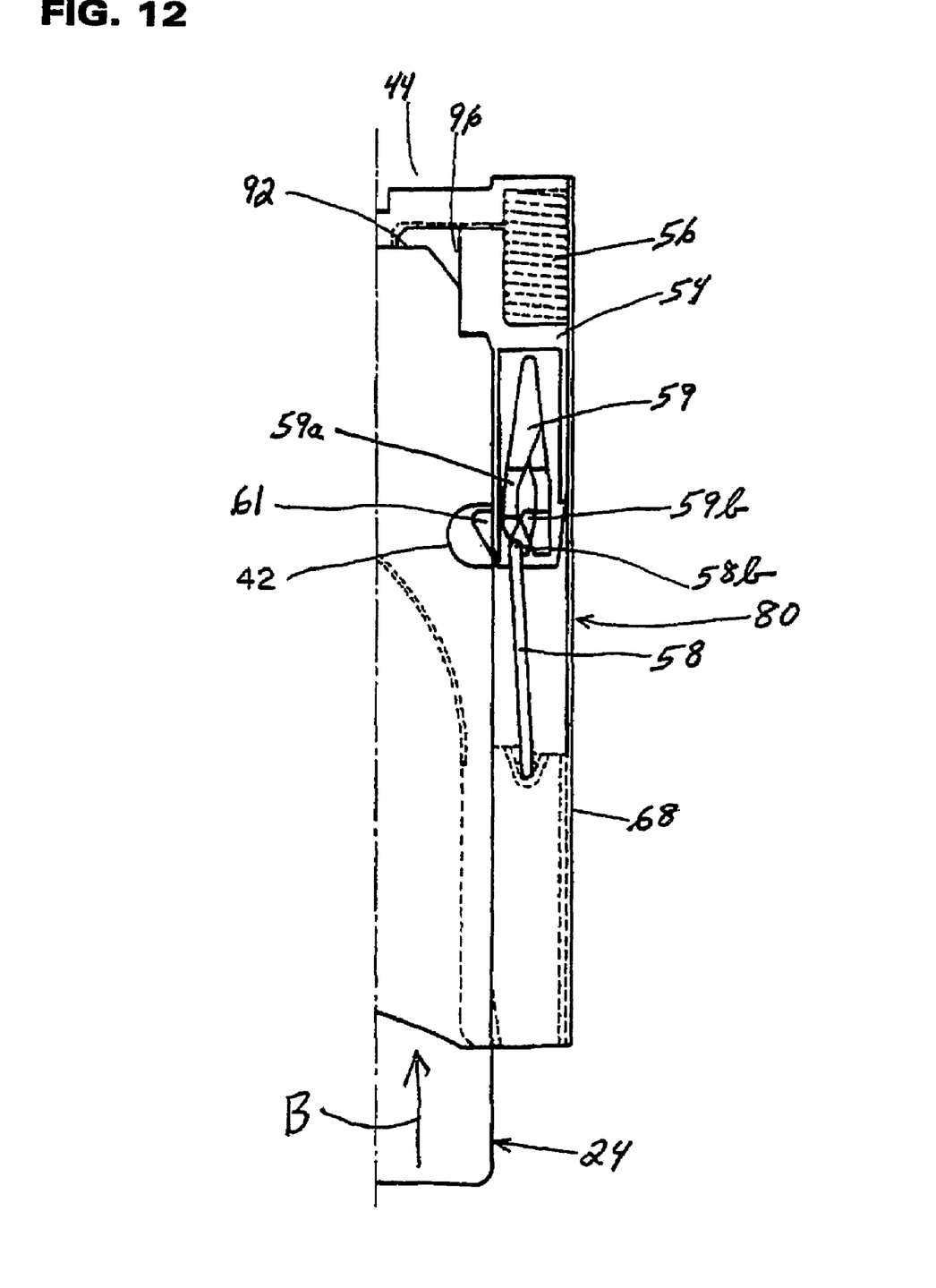
FIG. 12 is a view similar to that of FIG. 11, but with the memory card and slider being moved to their fully insertion position.
Figure 13:
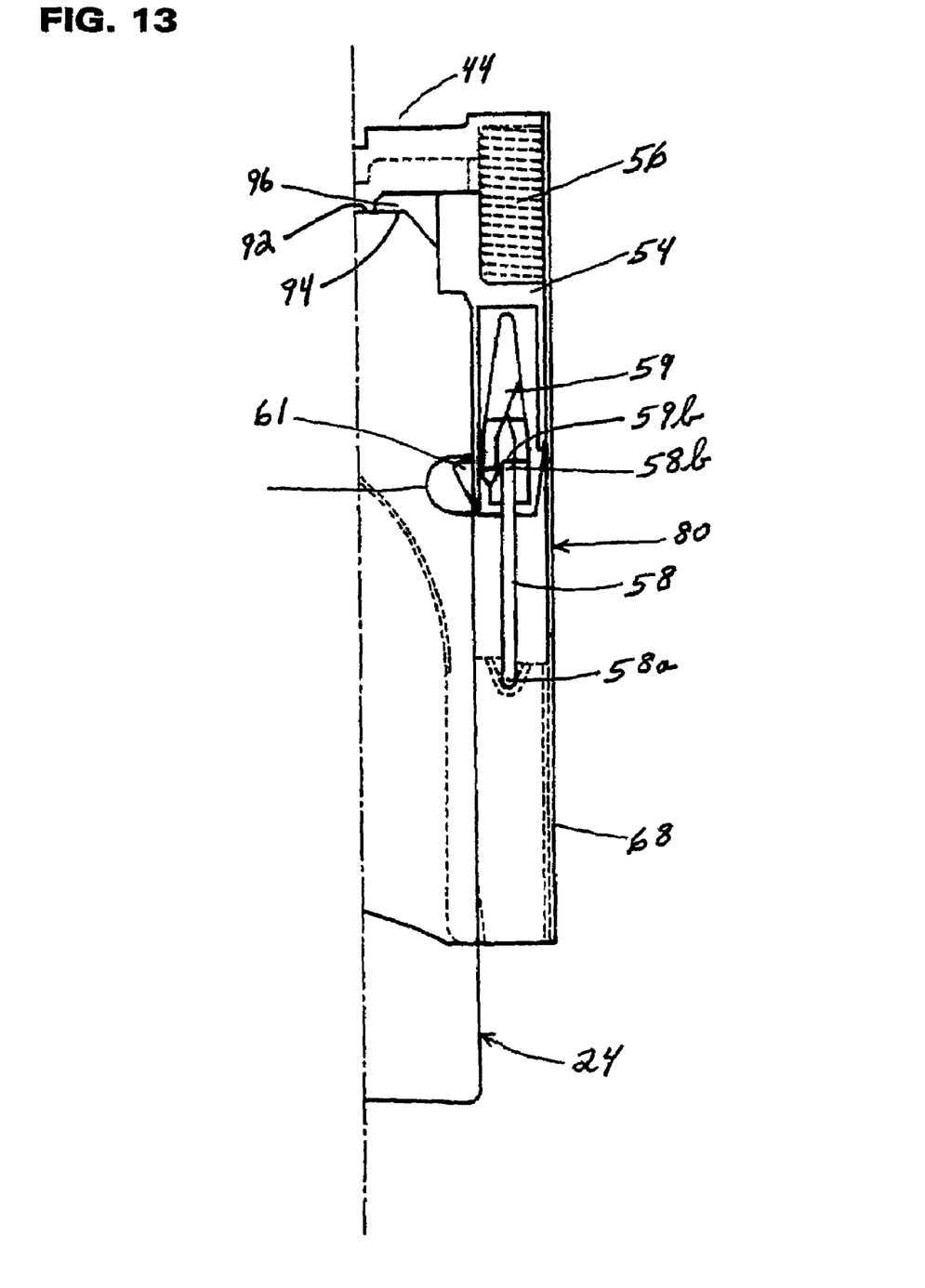
FIG. 13 is a view similar to that of FIG. 12, but in a condition of the ejecting device about to release the memory card.

FIG. 12 shows memory card 24 being pushed inwardly in the direction of arrow "B" to its fully inserted and mated position wherein contacts 36 on the memory card engage contact portions 20b of terminals 20. Referring to FIG. 12, pin portion 58b of pin member 50 moves along a cam slot portion 59a of heart-shaped cam slot 59. When the insertion force on the memory card is released, pin portion 58b moves into a stop groove 59b of the cam slot as shown in FIG. 13. Accordingly, cam slider 54 is stopped in the position of FIG. 13, compressing coil spring 56. The memory card, along with the cam slider which has moved therewith, remains in this fully inserted and mated condition of the card. As is known in the art with this type of push/pull ejecting device, if the memory card is again pushed inwardly, pin member 58 will move back into the heart-shaped cam slot and coil spring 56 will eject the card back to its temporary retained position shown in FIG. 11.

Figure 14:
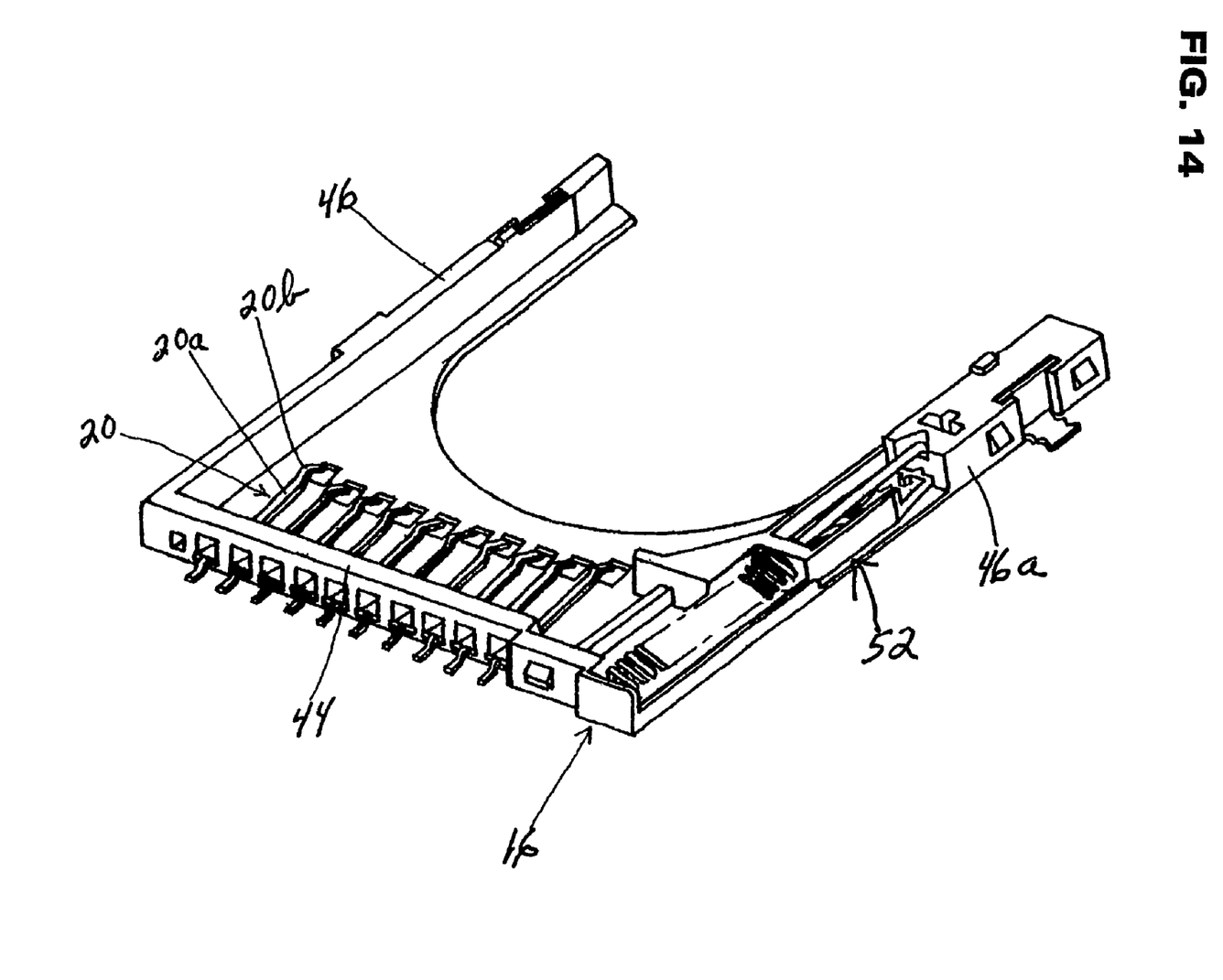
FIG. 14 is a perspective view of an insulating housing according to a second embodiment of a memory card connector for use with the invention.

FIG. 14 simply shows an alternative embodiment of the invention wherein housing 16 is in a generally U-shaped configuration rather than the L-shaped configuration of FIG. 1. In this configuration, the housing has a longitudinal side wall section 46 and a second, generally parallel side wall section 46a defining the U-shaped configuration of the housing. In this configuration, ejection mechanism 52 is mounted on side wall section 46a.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A memory card connector having an interior cavity into which a memory card is inserted to a temporary retained position and then to a fully inserted position, comprising:
    an insulating housing having a rear terminal-mounting section at a rear of the cavity;
    a plurality of terminals mounted on the terminal-mounting section of the housing and having contact portions for engaging contacts on the memory card;
    a slider movably mounted on the housing and engageable with the memory card for movement therewith, the slider being slidable along a side wall of the housing, and the slider having a projection engageable in a recess in a side of the memory card; and a sheet metal shell covering at least a portion of the insulating housing and including a cover plate overlying at least a portion of said cavity, a side wall plate depending from the cover plate and overlying at least a portion of the side wall of the housing, and a spring structure stamped and formed out of an opening in said side wall plate and engageable with the slider to bias the projection of the slider into the recess in the memory card, the spring structure being integral with the side wall plate at opposite edges of said opening.

2. The memory card connector of claim 1 wherein said slider includes an abutting surface for engaging a front end of the memory card.

3. The memory card connector of claim 1 wherein said slider includes a contact surface opposing the side wall plate of the metal shell and generally parallel thereto and a pushing surface opposing the spring structure of the metal shell.

4. The memory card connector of claim 3 wherein said pushing surface is oblique to said contact surface of the slider.

5. The memory card connector of claim 1 wherein said spring structure comprises a spring plate which is elongated in the direction of movement of the slider and memory card.

6. The memory card connector of claim 5 wherein said elongated spring plate has opposite end sections which are integral with the side wall plate of the metal shell within said opening.

7. The memory card connector of claim 6 wherein said elongated spring plate has a central section between said opposite end sections, the central section being wider than the end sections.

* * * * *